(12) United States Patent
Lei

(10) Patent No.: US 12,244,120 B2
(45) Date of Patent: Mar. 4, 2025

(54) RADIATION OUTPUT DEVICE AND METHOD THEREOF

(71) Applicant: Ningbo ABAX Sensing Electronic Technology Co., Ltd., Ningbo City (CN)

(72) Inventor: Shuyu Lei, Zhejiang (CN)

(73) Assignee: Ningbo Abax-Sensing Electronic Technology Co., Ltd., Ningbo (CN)

( * ) Notice: Subject to any disclaimer, the term of this patent is extended or adjusted under 35 U.S.C. 154(b) by 887 days.

(21) Appl. No.: 17/417,258

(22) PCT Filed: Oct. 9, 2019

(86) PCT No.: PCT/CN2019/110216
§ 371 (c)(1),
(2) Date: Jun. 22, 2021

(87) PCT Pub. No.: WO2020/134323
PCT Pub. Date: Jul. 2, 2020

(65) Prior Publication Data
US 2022/0077653 A1 Mar. 10, 2022

(30) Foreign Application Priority Data
Dec. 24, 2018 (CN) .......................... 201811583864.5

(51) Int. Cl.
*H01S 5/14* (2006.01)
*H01S 5/065* (2006.01)

(52) U.S. Cl.
CPC ............ *H01S 5/141* (2013.01); *H01S 5/0657* (2013.01)

(58) Field of Classification Search
CPC ........ H01S 5/141; H01S 5/0657; H01S 3/139; H01S 5/0687; H01S 5/0078; H01S 5/02469; H01S 5/06
See application file for complete search history.

(56) References Cited

U.S. PATENT DOCUMENTS

| 6,122,301 | A | * | 9/2000 | Tei | ......................... H01S 5/0687 372/20 |
| 2004/0109487 | A1 | * | 6/2004 | Zhang | ................. H01S 3/08031 372/20 |

(Continued)

FOREIGN PATENT DOCUMENTS

| CN | 103779778 A | 5/2014 |
| CN | 105511029 A | 4/2016 |

(Continued)

OTHER PUBLICATIONS

International Search Report, Application No. PCT/CN2019/110216, mailed Dec. 27, 2019, 4 pages.

*Primary Examiner* — Xinning(Tom) Niu
(74) *Attorney, Agent, or Firm* — Ziegler IP Law Group, LLC.

(57) ABSTRACT

The present application provides a radiation output device and a method. The radiation output device includes a radiation generating module configured to generate initial radiation; a filter module configured to reflect a portion of a first preset wavelength of the initial radiation to the radiation generating module and transmit a portion of a second preset wavelength of the initial radiation, the transmitted radiation is therefore used as an output radiation of the radiation output device; a detection feedback module, using a portion of or all of the output radiation as a feedback radiation, configured to instruct a modulating module to modulate the filter module according to the feedback radiation. The modulating module is connected to the filter module and configured to modulate a position and/or an angle of the filter module according to the instruction of the detection feedback module.

15 Claims, 2 Drawing Sheets

(56) References Cited

U.S. PATENT DOCUMENTS

| | | | | |
|---|---|---|---|---|
| 2004/0165639 | A1* | 8/2004 | Lang | H01S 5/141 |
| | | | | 372/20 |
| 2007/0047599 | A1* | 3/2007 | Wysocki | H01S 5/141 |
| | | | | 372/102 |
| 2015/0116801 | A1* | 4/2015 | Kadoya | H01S 5/02415 |
| | | | | 359/15 |

FOREIGN PATENT DOCUMENTS

| | | |
|---|---|---|
| CN | 106802186 A | 6/2017 |
| CN | 109672084 A | 4/2019 |
| JP | 2011249400 A | 12/2011 |

* cited by examiner

RADIATION OUTPUT DEVICE AND METHOD THEREOF

CROSS-REFERENCE TO RELATED APPLICATIONS

The present application claims priority of Chinese patent application No. CN201811583864.5, filed with the Chinese Patent Office on Dec. 24, 2018 and titled Radiation Output Device and Method thereof, the entire content of which is incorporated in the present application by reference.

FIELD OF THE INVENTION

The present application relates to the field of microelectronics technology, more specifically to a radiation output device and its method.

BACKGROUND OF THE INVENTION

This part of content is intended to provide a background or context to the embodiments of the present invention illustrated in the claims. The following description should not be deemed as prior art just because it is involved in this part.

Semiconductor lasers are widely used in the fields of communication, medical treatment, material processing, laser display and ranging due to its merits such as small size, light weight, high efficiency and direct modulation or adjustment. The spectrum of a laser light output by a semiconductor laser is distributed within a certain range of the center wavelength, that is, the spectrum of the laser light output by the semiconductor laser is essentially composed of a plurality of wavelengths distributed within a certain range. When the intensity of the laser light output by the laser drops from the peak value to half of the peak value, the interval between two adjacent wavelengths is the linewidth of the laser light output by the laser. The narrower the linewidth of the laser, the better the monochromaticity and coherence of the laser, and the wider the application range.

Narrow linewidth semiconductor laser mainly comprises distributed Bragg reflector (DBR), distributed feedback laser (DFL) and external cavity laser. Where external cavity laser is favored due to its merits such as narrow linewidth, high output power and low cost. However, since there is an increasingly high requirements in laser linewidth in relation to high-tech fields of lidar, aerospace and communications which the current linewidth of narrow linewidth semiconductor laser is unable to satisfy, it is urgent to optimize the output linewidth of narrow linewidth semiconductor laser from GHz level to KHz level. Additionally, narrow linewidth semiconductor laser further adopts gratings as mode selection filters for obtaining narrow linewidth output, i.e., laser. However, gratings are susceptible to influence caused by environment temperature and vibration, which could lead to instability of the laser wavelength output by narrow linewidth semiconductor laser and even causes the laser wavelength drifting. Therefore, it is urgent to provide a technical solution to solve the above-mentioned drawbacks existing in semiconductor lasers.

SUMMARY OF THE INVENTION

In order to overcome the existing drawbacks, the present application provides a radiation output device and a method. A first aspect of the present application provides a radiation output device, which comprises a radiation generating module configured to generate initial radiation; a filter module configured to reflect a portion of a first preset wavelength of the initial radiation to the radiation generating module and transmit a portion of a second preset wavelength of the initial radiation, the transmitted radiation is therefore used as an output radiation of the radiation output device; a detection feedback module, using a portion of or all of the output radiation as a feedback radiation, configured to instruct a modulating or adjustment module to modulate or adjust the filter module according to the feedback radiation. The modulating module is connected to the filter module and configured to modulate a position and/or an angle of the filter module according to the instruction of the detection feedback module.

One embodiment of the present application further comprises an optical splitter module configured to split the output radiation to obtain the feedback radiation and a subsequent output radiation.

The feedback radiation is configured to serve as an incident light of the detection feedback module. The subsequent output radiation is configured to serve as a work power supply.

In one embodiment of the present application, the detection feedback module comprises the following modules: a wave-locking module, a photoelectric conversion module and a driver module. Where the wave-locking module is configured to transmit the feedback radiation so as to select out partial radiation that meets a preset requirement. The photoelectric conversion module is configured to convert the partial radiation that meets the preset requirement into an electric signal. The driver module is configured to send a control signal to the modulating module according to the electric signal. The control signal is configured to control the modulating module to modulate the position and/or the angle of the filter module.

In one embodiment of the present application, the preset requirement comprises a transmittance of the wave-locking module to the feedback radiation. When a wavelength of the initial radiation is a first designated wavelength, a change rate corresponding to the transmittance is the largest.

In one embodiment of the present application, the driver module is further configured as: before sending the control signal to the modulating module, the control signal is generated according to a comparison result obtained by comparing the electric signal with a reference electric signal.

In one embodiment of the present application, the reference electric signal is converted by the partial radiation transmitted from the feedback radiation when the wave-locking module has a maximum change rate corresponding to the transmittance.

One embodiment of the present application, before controlling the modulating module to modulate the position and/or the angle of the filter module according to the electric signal, further comprises amplifying and/or converting the electric signal.

In one embodiment of the present application, the radiation output device further comprises a collimation module. The collimation module is disposed between the radiation generating module and the filter module. The collimation module comprises at least one lens element.

In one embodiment of the present application, the filter module is a volume Bragg grating; and/or the modulating module is a piezoelectric ceramic element.

In the embodiments of the present application, a cavity length of a resonant cavity and a reflection direction of the radiation output device is changed due to the filter module selectively reflecting the portion of radiation of the initial radiation back to the radiation generating module and a closed-loop control formed by the detection feedback module, the modulating module and the filter module. This not only helps to further enhance the light intensity of the output radiation to obtain a better monochromatic output radiation and further compress the output linewidth of the output radiation, but also helps to achieve a better cavity length in a limited space, and further enhance the performance of the output radiation. In addition, the present application has a simple structure, which reduces the number of packaged separate elements and process complexity, and at the same time greatly reduces the packaging space, product size, and cost.

BRIEF DESCRIPTION OF THE DRAWINGS

By reading the following detailed description with reference to the accompanying drawings, the above and other objectives, features, and merits of the exemplary embodiments of the present application will become easy to understand. In the accompanying drawings, several embodiments of the present application are shown in an exemplary and non-limiting manner.

In the drawings, the same or corresponding reference numerals indicate the same or corresponding parts.

DETAILED DESCRIPTION OF ILLUSTRATED EMBODIMENTS

Figure 1:
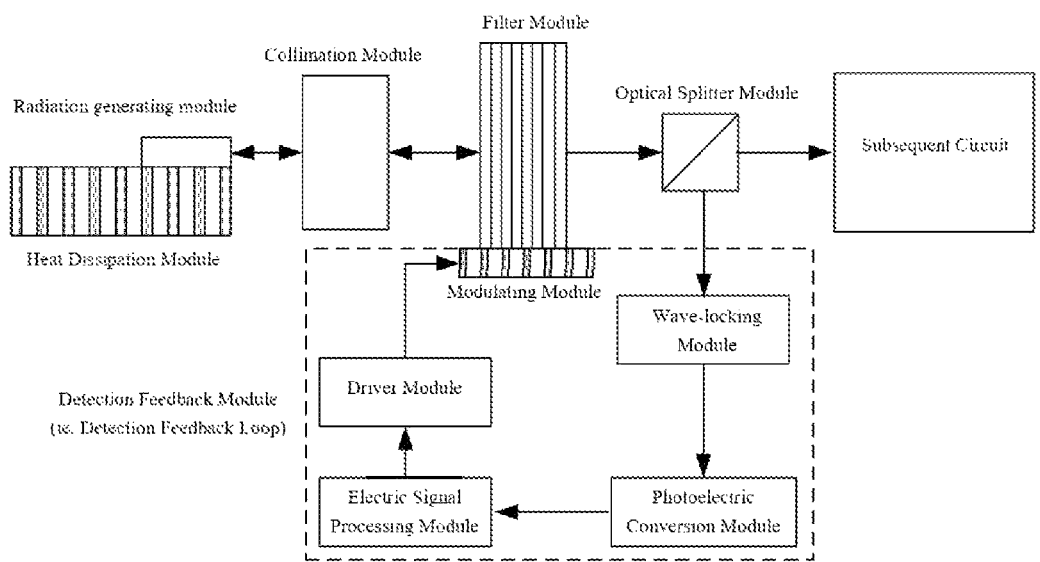
FIG. 1 is a schematic diagram showing a radiation output device according to an embodiment of the present application.

The principle and spirit of the present application will be described below with reference to several exemplary embodiments. It should be understood that these embodiments are provided to enable those skilled in the art to better understand and then implement the application rather than limiting the scope of the application in any way. On the contrary, these embodiments are provided to make this application more thorough and complete, and to fully convey the scope of this application to those skilled in the art.

The applicant has noticed that current output linewidth of semiconductor lasers is mostly in the GHz range, which is unable to satisfy the requirement in laser linewidth in relation to high-tech fields of lidar, aerospace and communications. Additionally, current semiconductor lasers adopt gratings as a mode selecting filter, which will lead to instability of laser wavelength output by semiconductor lasers and even cause the laser wavelength drifting.

In order to overcome the above-mentioned drawbacks in the prior art, the present application provides a radiation output device and a method. The radiation output device at least comprises a radiation generating module, a filter module, a detection feedback module and a modulating module. The radiation generating module is configured to generate initial radiation. The filter module is configured to reflect a portion of a first preset wavelength of the initial radiation to the radiation generating module and transmit a portion of a second preset wavelength of the initial radiation, the transmitted radiation is therefore used as an output radiation of the radiation output device. The detection feedback module is configured to obtain a portion of or all of the output radiation as a feedback radiation, and instruct the modulating module to modulate the filter module according to the feedback radiation. The modulating module is connected to the filter module and configured to modulate a position and/or an angle of the filter module according to the instruction of the detection feedback module.

The present application selectively reflect the portion of the initial radiation to the radiation generating module through the filter module so as to enhance the light intensity of the output radiation and compress the linewidth of the output radiation. A closed-loop control formed by the detection feedback module, the modulating module and the filter module further changes a cavity length of a resonant cavity and a reflection direction of the radiation output device. This not only helps to further enhance the light intensity of the output radiation to obtain a better monochromatic output radiation and further compress the output linewidth of the output radiation, but also helps to achieve a better cavity length in a limited space, and further enhance the performance of the output radiation. In addition, the present application has a simple structure, which reduces the number of packaged separate elements and process complexity, and at the same time greatly reduces the packaging space, product size, and cost.

After the introduction of the basic principle of the present application, various non-limiting implementation manners of the present application will be specifically described as below.

The embodiments of the present application are applicable to radiation output scenarios, especially to laser output scenarios, such as narrow linewidth laser output scenarios in relation to fields of lidar, aerospace and communications. The laser output device involved in the embodiments of the present application comprises but is not limited to semiconductor laser, laser chip, communication chip, and processor chip, which are not limited in the embodiments of the present application.

The embodiments of the present application provides a radiation output device with reference to FIG. 1. the radiation output device at least comprises a radiation generating module, a filter module, a detection feedback module and a modulating module. The specific modules/units in the radiation output device will be described and introduced below in conjunction with the accompanying drawings.

The radiation generating module is configured to generate an initial radiation. Taking the initial radiation of laser as an example, the spectrum of the initial radiation is not all concentrated at a central wavelength determined by a transition energy level but distributed within a certain range of the central wavelength, that is, the spectrum of the initial radiation is composed of multiple wavelengths distributed in a certain range. Optionally, when the wavelength of the initial radiation is a first designated wavelength, a change rate corresponding to a transmittance is the largest.

The filter module is configured to reflect a portion of a first preset wavelength of the initial radiation to the radiation generating module and transmit a portion of a second preset wavelength of the initial radiation, the transmitted radiation is therefore used as an output radiation of the radiation output device. The portion of the first preset wavelength of the initial radiation being reflected to the radiation generating module is able to enhance the light intensity of a central wavelength single mode so as to suppress other wavelength modes and causes the linewidth of the output radiation narrower. Optionally, the first preset wavelength is set as the central wavelength. Preferably, the filter module may be a volume Bragg grating with good wavelength selection capability, such as a reflective volume Bragg grating (R-VBG) with a certain function for the central wavelength. It should be noted that the filter module of the embodiments of the present application is not limited to volume Bragg grating, other modules/elements may be also adopted.

Optionally, the radiation output device further comprises an optical splitter module. The optical splitter module is disposed between the filter module and the detection feedback module. The optical splitter module is configured to split the output radiation to obtain the feedback radiation and a subsequent output radiation. Where the feedback radiation is configured to serve as an incident light of the detection feedback module. The subsequent output radiation is configured to serve as a work power supply. For example, the subsequent output radiation may be used as a work supply of a subsequent circuit shown in FIG. 1.

The detection feed module uses a portion of or all of the output radiation as a feedback radiation and is configured to instruct the modulating module to modulate the filter module according to the feedback radiation. In one possible implementation, after the portion of the transmitted output radiation from the filter module being input to the detection feedback module, the portion input to the detection feedback module is used as the feedback radiation. The detection feedback module converts the feedback radiation into an electric signal and comparing the electric signal with a reference electric signal to obtain a comparison result so as to detect whether the detection feedback module is able to instruct the modulating module to modulate the filter module according to the comparison result. In another possible implementation, during a preset modulating period of the filter module, after all of the output radiation transmitted from the filter module being input to the detection feedback module, the output radiation input to the detection feedback module is used as the feedback radiation. The detection feedback module converts the feedback radiation into an electric signal and comparing the electric signal with a reference electric signal to obtain a comparison result so as to detect whether the detection feedback module is able to instruct the modulating module to modulate the filter module according to the comparison result. It should be noted that during the preset modulating period of the filter module, the output radiation input to the detection feedback module may be a portion of the output radiation transmitted merely from the filter module, which is not limited.

In one possible implementation, the detection feedback module is composed of a plurality of sub-modules, that is, the detection feedback module comprises the following modules: a wave-locking module, a photoelectric conversion module and a driver module. Taking a detection feedback loop as shown in FIG. 1 as an example, the detection feedback loop comprises a wave-locking module, a photoelectric conversion module, an electric signal processing module and a driver module.

The wave-locking module is configured to transmit the feedback radiation so as to select out partial radiation that meets a preset requirement. Optionally, the preset requirement comprises a transmittance of the wave-locking module to the feedback radiation. Taking a wave locked mode selection element as the wave-locking module as an example, the transmittance of the wave-locking module is changed as the wavelength changes. The transmittance of the wave-locking module to a central wavelength radiation is significantly different from that of the wave-locking module to other wavelength radiation, that is, a change rate corresponding to the transmittance of the radiation being at the central wavelength is the largest. Therefore, a photocurrent corresponding to the radiation transmitted from the wave-locking module is also different. This helps determine whether an incident radiation wavelength of a reflection module is the central wavelength from the input. Optionally, the wave-locking module is an F-P etalon.

Figure 2:
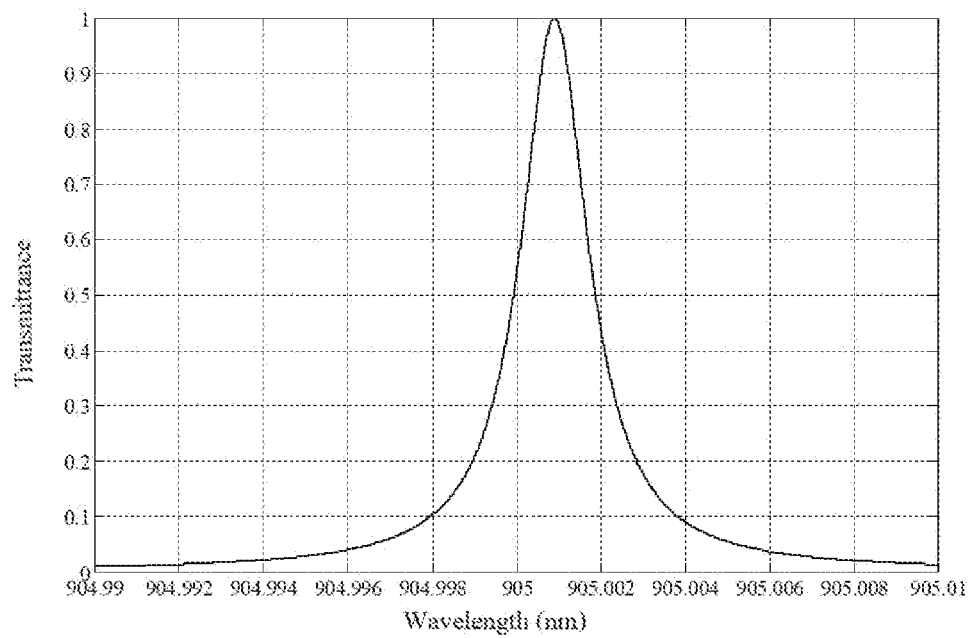
FIG. 2 is a schematic diagram showing a transmission waveform diagram according to an embodiment of the present application.

Photoelectric conversion module is configured to convert the partial radiation that meets the preset requirement into the electric signal. The electric signal changes as the transmittance of the wave-locking module is changing. A transmission waveform of the etalon is shown in FIG. 2. Taking the feedback radiation with the wavelength of 905 nm as an example, when a 905 nm wavelength transmission point is at the maximum slop of the transmission waveform, a current generated by wavelengths less than the 905 nm wavelength is significantly different from a current generated by the 905 nm wavelength, and a current generated by wavelengths greater than the 905 nm wavelength is significantly different from the current generated by the 905 nm wavelength. The photoelectric conversion module under this circumstance is able to convert a change of the current caused by the change of the wavelength into a change of a detection current (i.e., the electric signal). The detection current is configured to be input to the driver module.

The driver module is configured to send a control signal to the modulating module according to the electric signal. The control signal is configured to control the modulating module to modulate the position and/or the angle of the filter module. Before sending the control signal to the modulating module, the driver module is further configured to compare the electric signal with a preset reference electric signal to obtain a comparison result. And the control signal is generated according to the comparison result. In one possible implementation, the driver module detects whether the electric signal converted by the feedback radiation is different from the preset reference electric signal, if the difference exists, the control signal is generated to be sent to the modulating module. Optionally, the reference electric signal is the electric signal converted by a partial radiation transmitted from the feedback radiation when wave-locking module has the largest change rate corresponding to the transmittance, that is, a value of the reference electric signal equals a value of the electric signal converted by the partial radiation transmitted when the change rate of the transmittance of the wave-locking module, which is shown in FIG. 2 as the value of the electric signal corresponding to the point with the largest slope in the transmission waveform diagram.

Optionally, the detection feedback module further comprises the electric signal processing module. The electric signal processing module is configured to amplify the electric signal output by the photoelectric conversion module and output the amplified electric signal to the driver module. The amplified electric signal helps the driver module obtain a more accurate control signal, therefore is of assistance in modulating the filter module more accurately to improve the linewidth and optimize the performance of the output radiation. The electric signal processing module is also configured to convert the electric signal output by the photoelectric conversion module and output the converted electric signal to the driver module. Taking the modulating module as a piezoelectric ceramic element as an example, the electric signal processing module is able to convert the electric signal into a voltage signal, so as to achieve precise adjustment of the piezoelectric ceramic element by means of voltage control.

The modulating module is configured to modulate the position and/or the angle of the filter module according to the instruction of the detection feedback module. Optionally, the modulating module is electrically connected to the filter module and is able to change the cavity length and the reflection direction by modulating the position and/or the angle of the filter module. This not only helps a light reflected by the filter module to enter a laser radiation source but also helps obtain a better cavity length in the limited packaging space.

Optionally, the modulating module preferably to be a lead zirconate titanate piezoelectric ceramic device (PZT). The lead zirconate titanate piezoelectric ceramic device is able to quickly and accurately navigate, an amount of micro-displacement of which is proportional to an input voltage and a response time of which is microseconds level. The embodiments of the present application do not limit the modulating module as the piezoelectric ceramic element, other modules/elements may be also adopted as the modulating module.

Since radiation will diverge on both fast axis and slow axis, the radiation output device is also preferably provided with a collimating module. The collimation module is disposed between the radiation generating module and the filter module. The collimation module comprises at least one lens element.

Due to the inevitable existence of various non-radiation recombination losses, free carrier absorption and other losses during the work process of the radiation generating module, an injected electric power is converted into heat and a temperature of the radiation generating module rises. However, the temperature rise will cause a decrease in an output power of the laser radiation source and a drift in the wavelength, so a heat dissipation module is also provided at a bottom of the radiation generating module.

Examples

Assuming that the central wavelength is 905 nm; the radiation generating module is the laser radiation source; the filter module is the reflective volume Bragg grating; the optical splitter module is an optical splitter; the collimating module is a collimation lens; the first preset wavelength is 905 nm; the detection feedback module comprises the E-P etalon (i.e., the wave-locking module), a photodiode (ie. the photoelectric conversion module), the electric signal processing module and the driver module; the modulating module is the PZT. Therefore, the initial radiation generated by the laser radiation source enters the reflective volume Bragg grating. The reflective volume Bragg grating reflect a portion of the initial radiation with the wavelength of 905 nm to the laser radiation source through the collimation lens. A reflectivity is greater than or equals to 90%. The radiation reflected back to the laser radiation source is filtered by the reflective volume Bragg grating so as to obtain a narrower output linewidth, which helps induce more single-frequency lasers, suppress radiation in other spectrum ranges, and further compress the linewidth, so that the output linewidth of the radiation output device can be reduced to 100 KHz level.

The reflective volume Bragg grating transmits the output radiation from the initial radiation and enters the detection feedback module after split by the optical splitter. The portion of the radiation with the wavelength of 905 nm in the feedback radiation is transmitted to the photodiode through the F-P etalon, and the photodiode convert the portion of the radiation into the detection current and output to the electrical signal processing module. After the portion of the radiation is amplified by the electrical signal processing module converted into the voltage signal, the driver module is used to control the PZT to modulate the amount of micro-displacement of the reflective volume Bragg grating, thereby controlling a rotation of the reflective volume Bragg grating and a forward and backward movement distance along an optical path direction so as to obtain the best reflection angle and cavity length and achieve narrow linewidth output.

Figure 3:
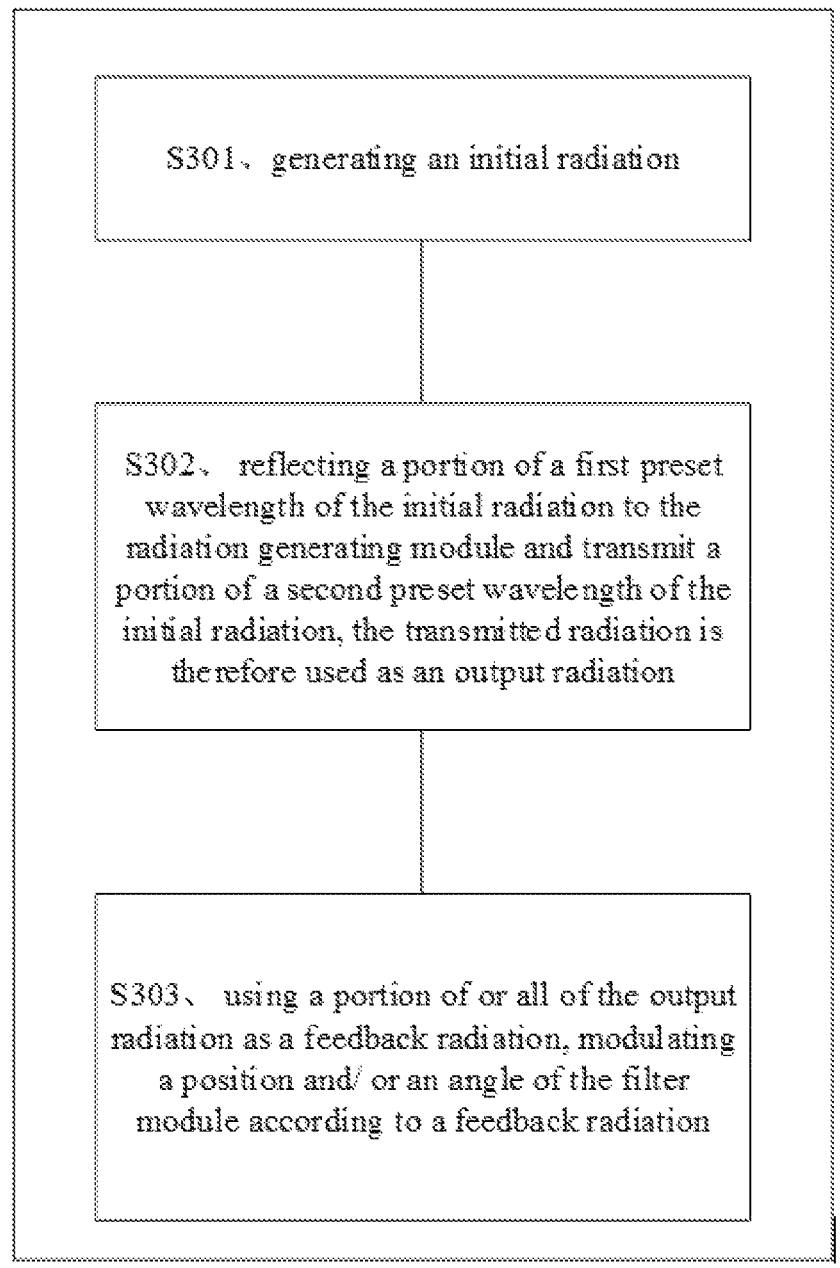
FIG. 3 is a schematic diagram showing a flow chart of a radiation output method according to an embodiment of the present application.

The embodiments of the present application provide a radiation output method as shown in FIG. 3. The method comprises the following steps.

S301 generating an initial radiation;

S302 reflecting a portion of a first preset wavelength of the initial radiation to the radiation generating module and transmit a portion of a second preset wavelength of the initial radiation, the transmitted radiation is therefore used as an output radiation;

S303 using a portion of or all of the output radiation as a feedback radiation, modulating a position and/or an angle of the filter module according to a feedback radiation.

In the radiation output method provided in the embodiments of the present application, the filter module selectively reflects the portion of radiation of the initial radiation and detects the portion of or all of the output radiation to modulate the position and/or the angle of the filter module to form a closed-loop control so as to change a cavity length of a resonant cavity and a reflection direction of the radiation output device. This not only helps to further enhance the light intensity of the output radiation to obtain a better monochromatic output radiation and further compress the output linewidth of the output radiation, but also helps to achieve a better cavity length in a limited space, and further enhance the performance of the output radiation.

In S302, the portion of the first preset wavelength of the initial radiation being reflected to the radiation generating module is able to enhance the light intensity of a central wavelength single mode so as to suppress other wavelength modes and causes the linewidth of the output radiation narrower. Optionally, the first preset wavelength is set as the central wavelength. Preferably, the filter module may be a volume Bragg grating with good wavelength selection capability, such as a reflective volume Bragg grating (R-VBG) with a certain function for the central wavelength. It should be noted that the filter module of the embodiments of the present application is not limited to volume Bragg grating, other modules/elements may be also adopted.

After S302 before S303, splitting the output radiation to obtain the feedback radiation and a subsequent output radiation. The feedback radiation is configured to serve as an incident light of the detection feedback module. The subsequent output radiation is configured to serve as a work power supply. For example, the subsequent output radiation may be used as a work supply of a subsequent circuit shown in FIG. 1.

In S303, there are various specific implementations for using the portion of or all of the output radiation as the feedback radiation to modulate the position and/or the angle of the filter module according to the feedback radiation, which is not limited in the embodiments of the present application. One possible implementation may be: transmitting the feedback radiation so as to select out partial radiation that meets a preset requirement. The selected partial radiation that meets the preset requirement is converted into an electric signal. And the electric signal controls the modulating module to modulate the position and/or the angle of the filter module. The preset requirement comprises but is not limited to a transmittance of the wave-locking module to the feedback radiation. Furthermore, when a wavelength of the initial radiation is a first designated wavelength, a change rate corresponding to the transmittance is the largest.

Optionally, one of the implementations in S303 that modulating the position and/or the angle of the filter module according to the electric signal controlling the modulating module may be: comparing the electric signal with a reference electric signal to obtain a comparison result and then control the modulating module to modulate the position and/or the angle of the filter module according to the comparison result. Furthermore, the reference electric signal may be converted by the partial radiation transmitted from the feedback radiation when the wave-locking module has a maximum change rate corresponding to the transmittance. Furthermore, before modulating the position and/or the angle of the filter module according to the electric signal controlling the modulating module, the electric signal converted from the partial radiation that meets the preset requirement is amplified and/or converted.

Since radiation will diverge on both fast axis and slow axis, the radiation output device is also preferably provided with a collimating module. The collimation module is disposed between the radiation generating module and the filter module. The collimation module comprises at least one lens element.

Preferably, the position and/or the angle of the filter module may be modulated via the modulating module. The modulating module is a piezoelectric ceramic element, especially a lead zirconate titanate piezoelectric ceramic device (PZT). The lead zirconate titanate piezoelectric ceramic device is able to quickly and accurately navigate, an amount of micro-displacement of which is proportional to an input voltage and a response time of which is microseconds level. The embodiments of the present application do not limit the modulating module as the piezoelectric ceramic element, other modules/elements may be also adopted as the modulating module.

It should be noted that the method shown in FIG. 3 is similar to any one of the embodiments of the radiation output device shown in FIG. 1. Similarities could be referred to each other, which is omitted.

It should be noted that although several units/modules or sub-units/modules of the device are mentioned in the above detailed description, this division is only exemplary and not mandatory. In fact, according to the embodiments of the present application, the features and functions of two or more units/modules described above can be embodied in one unit/module. Conversely, the features and functions of one unit/module described above can be further divided into multiple units/modules to be embodied.

In addition, although the operations of the method of the present application are described in a specific order in the drawings, this does not require or imply that these operations must be performed in the specific order, or that all the operations shown must be performed to achieve the desired result. Additionally or alternatively, some steps may be omitted, multiple steps may be combined into one step for execution, and/or one step may be decomposed into multiple steps for execution.

Although the spirit and principle of the present application have been described with reference to several specific embodiments, it should be understood that the present application is not limited to the specific embodiments disclosed, and the division of various aspects does not mean that the features in these aspects cannot be combined. Benefit, this division is only for the convenience of presentation. This application is intended to cover various modifications and equivalent arrangements included within the spirit and scope of the appended claims.

What is claimed is:

1. A radiation output device comprising:
   a radiation generating module configured to generate initial radiation;
   a filter module configured to reflect a portion of a first preset wavelength of the initial radiation to the radiation generating module and transmit a portion of a second preset wavelength of the initial radiation, the transmitted radiation is therefore used as an output radiation of the radiation output device;
   a detection feedback module, using a portion of or all of the output radiation as a feedback radiation, configured to instruct a modulating module to modulate the filter module according to the feedback radiation; and
   an optical splitter module configured to split the output radiation to obtain the feedback radiation and a subsequent output radiation;
   wherein the modulating module is connected to the filter module and configured to modulate a position and an angle of the filter module according to the instruction of the detection feedback module;
   wherein the feedback radiation is configured to serve as an incident light of the detection feedback module, the subsequent output radiation is configured to serve as a work power supply;
   wherein the feedback radiation is the detection feedback module comprises the following modules: a wave-locking module, a photoelectric conversion module and a driver module;
   wherein the wave-locking module is configured to transmit the feedback radiation so as to select out partial radiation that meets a preset requirement;
   the photoelectric conversion module is configured to convert the partial radiation that meets the preset requirement into an electric signal; and
   the driver module is configured to send a control signal to the modulating module according to the electric signal, and the control signal is configured to control the modulating module to modulate the position and the angle of the filter module.

2. The device according to claim 1, wherein the preset requirement comprises a transmittance of the wave-locking module to the feedback radiation; and
   when a wavelength of the initial radiation is a first preset wavelength, a change rate corresponding to the transmittance is the largest.

3. The device according to claim 1, wherein the driver module is further configured as:
   before sending the control signal to the modulating module, the control signal is generated according to a comparison result obtained by comparing the electric signal with a reference electric signal.

4. The device according to claim 3, wherein
   the reference electric signal is converted by the partial radiation transmitted from the feedback radiation when the wave-locking module has a maximum change rate corresponding to the transmittance.

5. The device according to claim 1, wherein the detection feedback module further comprises an electric signal processing module, which is configured to amplify and convert the electric signal output by the photoelectric conversion module and output to the driver module.

6. The device according to claim 1, further comprising a collimation module, and wherein the collimation module is disposed between the radiation generating module and the filter module; and the collimation module comprises at least one lens element.

7. The device according to claim 1, wherein the filter module is a volume Bragg grating, and the modulating module is a piezoelectric ceramic element.

8. A radiation output method, applicable to the radiation output device according to claim 1, comprising:

generating an initial radiation;

reflecting a portion of a first preset wavelength of the initial radiation to the radiation generating module and transmit a portion of a second preset wavelength of the initial radiation, the transmitted radiation is therefore used as an output radiation; and using a portion of or all of the output radiation as a feedback radiation, modulating a position and an angle of the filter module according to a feedback radiation.

9. A radiation output device comprising:

a radiation generating module configured to generate initial radiation;

a filter module configured to reflect a portion of a first preset wavelength of the initial radiation to the radiation generating module and transmit a portion of a second preset wavelength of the initial radiation, the transmitted radiation is therefore used as an output radiation of the radiation output device;

a detection feedback module, using a portion of or all of the output radiation as a feedback radiation, configured to instruct a modulating module to modulate the filter module according to the feedback radiation; and an optical splitter module configured to split the output radiation to obtain the feedback radiation and a subsequent output radiation;

wherein the modulating module is connected to the filter module and configured to modulate a position and an angle of the filter module according to the instruction of the detection feedback module;

wherein the feedback radiation is configured to serve as an incident light of the detection feedback module, the subsequent output radiation is configured to serve as a work power supply;

wherein the feedback radiation is the detection feedback module comprises the following modules: a wave-locking module, a photoelectric conversion module and a driver module;

wherein the wave-locking module is configured to transmit the feedback radiation so as to select out partial radiation that meets a preset requirement;

the photoelectric conversion module is configured to convert the partial radiation that meets the preset requirement into an electric signal;

the driver module is configured to send a control signal to the modulating module according to the electric signal, and the control signal is configured to control the modulating module to modulate the position and the angle of the filter module;

wherein the preset requirement comprises a transmittance of the wave-locking module to the feedback radiation; and when a wavelength of the initial radiation is a first preset wavelength, a change rate corresponding to the transmittance is the largest.

10. The device according to claim 9, wherein the driver module is further configured as:

before sending the control signal to the modulating module, the control signal is generated according to a comparison result obtained by comparing the electric signal with a reference electric signal.

11. The device according to claim 10, wherein the reference electric signal is converted by the partial radiation transmitted from the feedback radiation when the wave-locking module has a maximum change rate corresponding to the transmittance.

12. The device according to claim 9, wherein the detection feedback module further comprises an electric signal processing module, which is configured to amplify and convert the electric signal output by the photoelectric conversion module and output to the driver module.

13. The device according to claim 9, further comprising a collimation module, and wherein the collimation module is disposed between the radiation generating module and the filter module; and the collimation module comprises at least one lens element.

14. The device according to claim 9, wherein the filter module is a volume Bragg grating, and the modulating module is a piezoelectric ceramic element.

15. A radiation output method, applicable to the radiation output device according to claim 9, comprising:

generating an initial radiation;

reflecting a portion of a first preset wavelength of the initial radiation to the radiation generating module and transmit a portion of a second preset wavelength of the initial radiation, the transmitted radiation is therefore used as an output radiation; and using a portion of or all of the output radiation as a feedback radiation, modulating a position and an angle of the filter module according to a feedback radiation.

* * * * *